US008999819B2

(12) United States Patent
Kozicki et al.

(10) Patent No.: US 8,999,819 B2
(45) Date of Patent: Apr. 7, 2015

(54) DENDRITIC METAL STRUCTURES, METHODS FOR MAKING DENDRITIC METAL STRUCTURES, AND DEVICES INCLUDING THEM

(75) Inventors: Michael N. Kozicki, Phoenix, AZ (US); Minghan Ren, Vancouver (CA)

(73) Assignee: Arizona Board of Regents, A Body Corporate of the State of Arizona Acting For on Behalf of Arizona State University, Scottsdale, AZ (US)

( * ) Notice: Subject to any disclaimer, the term of this patent is extended or adjusted under 35 U.S.C. 154(b) by 88 days.

(21) Appl. No.: 13/883,524

(22) PCT Filed: Nov. 11, 2011

(86) PCT No.: PCT/US2011/060402
§ 371 (c)(1),
(2), (4) Date: May 3, 2013

(87) PCT Pub. No.: WO2012/065083
PCT Pub. Date: May 18, 2012

(65) Prior Publication Data
US 2013/0228821 A1    Sep. 5, 2013

Related U.S. Application Data

(60) Provisional application No. 61/413,452, filed on Nov. 14, 2010.

(51) Int. Cl.
*H01L 21/479* (2006.01)
*H01L 21/288* (2006.01)
(Continued)

(52) U.S. Cl.
CPC .............. *H01L 21/2885* (2013.01); *C25D 3/38* (2013.01); *C25D 3/46* (2013.01); *C25D 5/54* (2013.01);
(Continued)

(58) Field of Classification Search
CPC ................... H01L 31/022425; H01L 2924/00; H01L 2924/0002; H01L 33/38; H01L 2224/48091
USPC ............................................ 438/98, 468, 610
See application file for complete search history.

(56) References Cited

U.S. PATENT DOCUMENTS

| 4,038,158 | A | 7/1977 | Bursey et al. |
| 4,158,807 | A | 6/1979 | Senturia |

(Continued)

FOREIGN PATENT DOCUMENTS

| WO | 98/48319 | 10/1998 |
| WO | 2007/102988 A2 | 9/2007 |
| WO | 2010/077622 A1 | 7/2010 |

OTHER PUBLICATIONS

Heer et al, Single-chip Microelectronic System to Interface with Living Cells, Biosensors and Bioelectronics, vol. 22, No. 11, pp. 2546-3553 (2007).

(Continued)

*Primary Examiner* — Andy Huynh
(74) *Attorney, Agent, or Firm* — McDonnell Boehnen Hulbert & Berghoff LLP

(57) ABSTRACT

The present invention relates generally to dendritic metal structures and devices including them. The present invention also relates particularly to methods for making dendritic metal structures without the use of solid electrolyte materials. In one aspect, a method for constructing a dendritic metal structure includes providing a substrate having a surface and a cathode disposed on the surface; providing an anode comprising a metal; and disposing a liquid on the surface of the substrate, such that the liquid is in electrical contact with the anode and the cathode; and then applying a bias voltage across the cathode and the anode sufficient to grow the dendritic metal structure extending from the cathode. The methods described herein can be used to grow dendritic metal electrodes, which can be useful in devices such as LEDs, touchscreens, solar cells and photodetectors.

14 Claims, 6 Drawing Sheets

(51) Int. Cl.

| | | |
|---|---|---|
| *C25D 5/54* | (2006.01) | |
| *C25D 7/00* | (2006.01) | |
| *C25D 7/08* | (2006.01) | |
| *H01L 23/482* | (2006.01) | |
| *H01L 31/0224* | (2006.01) | |
| *H01L 29/41* | (2006.01) | |
| *H01L 33/38* | (2010.01) | |
| *C25D 7/12* | (2006.01) | |
| *C25D 3/38* | (2006.01) | |
| *C25D 3/46* | (2006.01) | |

(52) U.S. Cl.
CPC .. *C25D 7/00* (2013.01); *C25D 7/08* (2013.01); *H01L 23/4827* (2013.01); *H01L 31/022408* (2013.01); *H01L 31/022425* (2013.01); *H01L 2924/12044* (2013.01); *Y02E 10/50* (2013.01); *H01L 29/413* (2013.01); *H01L 33/38* (2013.01); *C25D 7/126* (2013.01); *H01L 2924/0002* (2013.01)

(56) References Cited

U.S. PATENT DOCUMENTS

| | | | |
|---|---|---|---|
| 4,586,988 A | 5/1986 | Nath et al. | |
| 5,477,088 A | 12/1995 | Rockett et al. | |
| 5,761,115 A | 6/1998 | Kozicki et al. | |
| 5,896,312 A | 4/1999 | Kozicki et al. | |
| 5,914,893 A | 6/1999 | Kozicki et al. | |
| 6,184,456 B1 | 2/2001 | Matsuyama et al. | |
| 6,388,324 B2 | 5/2002 | Kozicki | |
| 6,418,049 B1 | 7/2002 | Kozicki et al. | |
| 6,469,364 B1 | 10/2002 | Kozicki | |
| 6,487,106 B1 | 11/2002 | Kozicki | |
| 6,635,914 B2 | 10/2003 | Kozicki et al. | |
| 6,798,692 B2 | 9/2004 | Kozicki et al. | |
| 6,825,489 B2 | 11/2004 | Kozicki | |
| 6,865,117 B2 | 3/2005 | Kozicki | |
| 6,914,802 B2 | 7/2005 | Kozicki | |
| 6,927,411 B2 | 8/2005 | Kozicki | |
| 6,940,745 B2 | 9/2005 | Kozicki | |
| 6,985,378 B2 | 1/2006 | Kozicki | |
| 6,998,312 B2 | 2/2006 | Kozicki et al. | |
| 7,006,376 B2 | 2/2006 | Kozicki | |
| 7,101,728 B2 | 9/2006 | Kozicki et al. | |
| 7,142,450 B2 | 11/2006 | Kozicki et al. | |
| 7,145,794 B2 | 12/2006 | Kozicki | |
| 7,169,635 B2 | 1/2007 | Kozicki | |
| 7,180,104 B2 | 2/2007 | Kozicki | |
| 7,227,169 B2 | 6/2007 | Kozicki | |
| 7,288,781 B2 | 10/2007 | Kozicki | |
| 7,294,875 B2 | 11/2007 | Kozicki | |
| 7,372,065 B2 | 5/2008 | Kozicki et al. | |
| 7,385,219 B2 | 6/2008 | Kozicki et al. | |
| 7,402,847 B2 | 7/2008 | Kozicki et al. | |
| 7,405,967 B2 | 7/2008 | Kozicki et al. | |
| 7,560,722 B2 | 7/2009 | Kozicki | |
| 7,675,766 B2 | 3/2010 | Kozicki | |
| 7,728,322 B2 | 6/2010 | Kozicki | |
| 7,763,158 B2 | 7/2010 | Kozicki | |
| 7,852,451 B2 | 12/2010 | Kim et al. | |
| 8,039,870 B2 | 10/2011 | Burke et al. | |
| 8,345,910 B2 | 1/2013 | Chae et al. | |
| 2002/0055239 A1 | 5/2002 | Tuominen et al. | |
| 2002/0168820 A1 | 11/2002 | Kozicki et al. | |
| 2007/0275230 A1 | 11/2007 | Murphy et al. | |
| 2008/0260941 A1 | 10/2008 | Jin | |
| 2009/0186756 A1 | 7/2009 | Cheng et al. | |
| 2009/0242416 A1 | 10/2009 | Yun et al. | |
| 2010/0193365 A1 | 8/2010 | Lopatin et al. | |
| 2010/0216026 A1 | 8/2010 | Lopatin et al. | |
| 2011/0038497 A1* | 2/2011 | Chae et al. | ............ 381/312 |
| 2011/0254117 A1 | 10/2011 | Kozicki | |

OTHER PUBLICATIONS

Kozicki et al., Nanostrcuture of solid electrolytes and surface electrodeposits, Physica E, vol. 19, No. 1-2, pp. 161-166 (2003).

Kozicki et al., Electrodeposit formation in solid electrolytes, 7th Annual Non-Volatile Memory Technology Symposium, pp. 111-115 (2006).

Balakrishnan et al., A low power non-volatile memory element based on copper in deposited silicon oxide, 7th Annual Non-Volatile Memory Technology Symposium, pp. 104-110 (2006).

International Search Report PCT/US2011/60402, mailed Apr. 3, 2012.

* cited by examiner

ND METHODS FOR MAKING DENDRITIC
DENDRITIC METAL STRUCTURES, METHODS FOR MAKING DENDRITIC METAL STRUCTURES, AND DEVICES INCLUDING THEM

CROSS-REFERENCE TO RELATED APPLICATIONS

The present application claims the priority of U.S. Provisional Patent Application Ser. No. 61/413,452, filed Nov. 14, 2010, which is hereby incorporated herein by reference in its entirety.

BACKGROUND OF THE INVENTION

1. Field of the Invention

The present invention relates generally to dendritic metal structures and devices including them. The present invention also relates particularly to methods for making dendritic metal structures without the use of solid electrolyte materials.

2. Technical Background

Electrically active structures find use in a variety of applications. One type of electrically active structure is a current generating structure, in which current is generated in response to an external stimulus. For example, solar cells are based on structures that generate current in response to absorption of solar radiation. This current can be collected to provide electrical energy. Similarly, optical sensors such as photodetectors can be based on current generating structures; absorption of an optical signal can generate current, which is electrically detected and can be correlated with an external stimulus. One type of common current generating structure is a p-n junction formed from a layer of p-type semiconductor in contact with a layer of n-type semiconductor. In such structures, absorbed light energy creates electron-hole pairs to generate current. Another example of an electrically active structure is a liquid crystal material, which changes its molecular alignment, and therefore its optical properties in response to an external field. Similarly, an electro-optic material can change its optical properties in response to an external field. Light emitting diodes (e.g., organic light emitting diodes) generate light in response to electrical energy. These electrically active structures are generally disposed between electrodes that collect the generated current or apply the external field.

However, electrode designs commonly used with electrically active structures suffer from a number of disadvantages. For example, conventional solar cells are formed from a current generating structure disposed on a bottom electrode and having a top electrode formed thereon. The top electrode is often formed as a series of wide bus bars with somewhat narrower branches extending between them. The dimensions of these electrodes (e.g., their line widths and the spaces between them) are generally large due to manufacturing cost limitations. The relatively large space between electrodes can create a high series resistance between the current generating sites and the top electrode, leading to inefficient energy collection from the areas of the current generating structure that are farthest from the electrodes. Packing the electrode structures more tightly is not a suitable solution, as a greater amount of electrode material will shield the current generating material from solar radiation, thereby rendering it useless for energy generation. Accordingly, using conventional techniques solar cell designers have to sacrifice efficient current collection in order to avoid blocking too much of the electrically active structure from light, leading to an inefficient use of the current collecting material, and therefore to lower energy generated per unit area. Similarly, liquid crystal and electro-optic devices require at least one electrode to allow a substantial amount of light to interact with the liquid crystal material and its tunable optical properties. There are transparent electrode materials, such as indium tin oxide, but these can be brittle, and prone to cracking when flexed.

Dendritic metal structures have been suggested for use as electrodes for use with electrically active structures. However, these designs can be improved. In some situations, for example, the solid electrolyte used to make the dendritic metal structures can be sufficiently light-absorbing to have an effect on final device performance.

Accordingly, there remains a need for electrode designs that can provide efficient electrical properties (e.g., current collection and field maintenance) while not blocking too much of the electrically active structure from light.

SUMMARY OF THE INVENTION

One aspect of the invention is a method for constructing a dendritic metal structure. The method includes providing a substrate having a surface and a cathode disposed on the surface; providing an anode comprising a metal; and disposing a liquid on the surface of the substrate (in any desired order), such that the liquid is in electrical contact with the anode and the cathode; and then applying a bias voltage across the cathode and the anode sufficient to grow the dendritic metal structure extending from the cathode.

Another aspect of the invention is an electrical device including a first electrode having at least one dendritic metal structure; a second electrode; and an electrically active structure disposed between the dendritic metal structure and the second electrode, wherein substantially no solid electrolyte is in contact with the dendritic metal structure. The electrical device according to this aspect of the invention can be made using the methods described herein.

Another aspect of the invention is an electrical device including a substantially non-conductive material; and an electrode including at least one dendritic metal structure disposed on the substantially non-conductive material, wherein substantially no solid electrolyte is in contact with the dendritic metal structure.

Another aspect of the invention is a device including a substantially non-conductive substrate, and at least one dendritic metal structure disposed on the substrate, wherein substantially no solid electrolyte is in contact with the dendritic metal structure.

The methods and devices described herein can be used in the construction of a variety of devices, including, for example, solar cells, a variety of sensors such as photo detectors, touchscreens and light-emitting diodes.

The invention will be further described with reference to embodiments depicted in the appended figures. It will be appreciated that elements in the figures are illustrated for simplicity and clarity and have not necessarily been drawn to scale. For example, the dimensions of some of the elements in the figures may be exaggerated relative to other elements to help to improve understanding of embodiments of the invention.

DETAILED DESCRIPTION OF THE INVENTION

Figure 1:
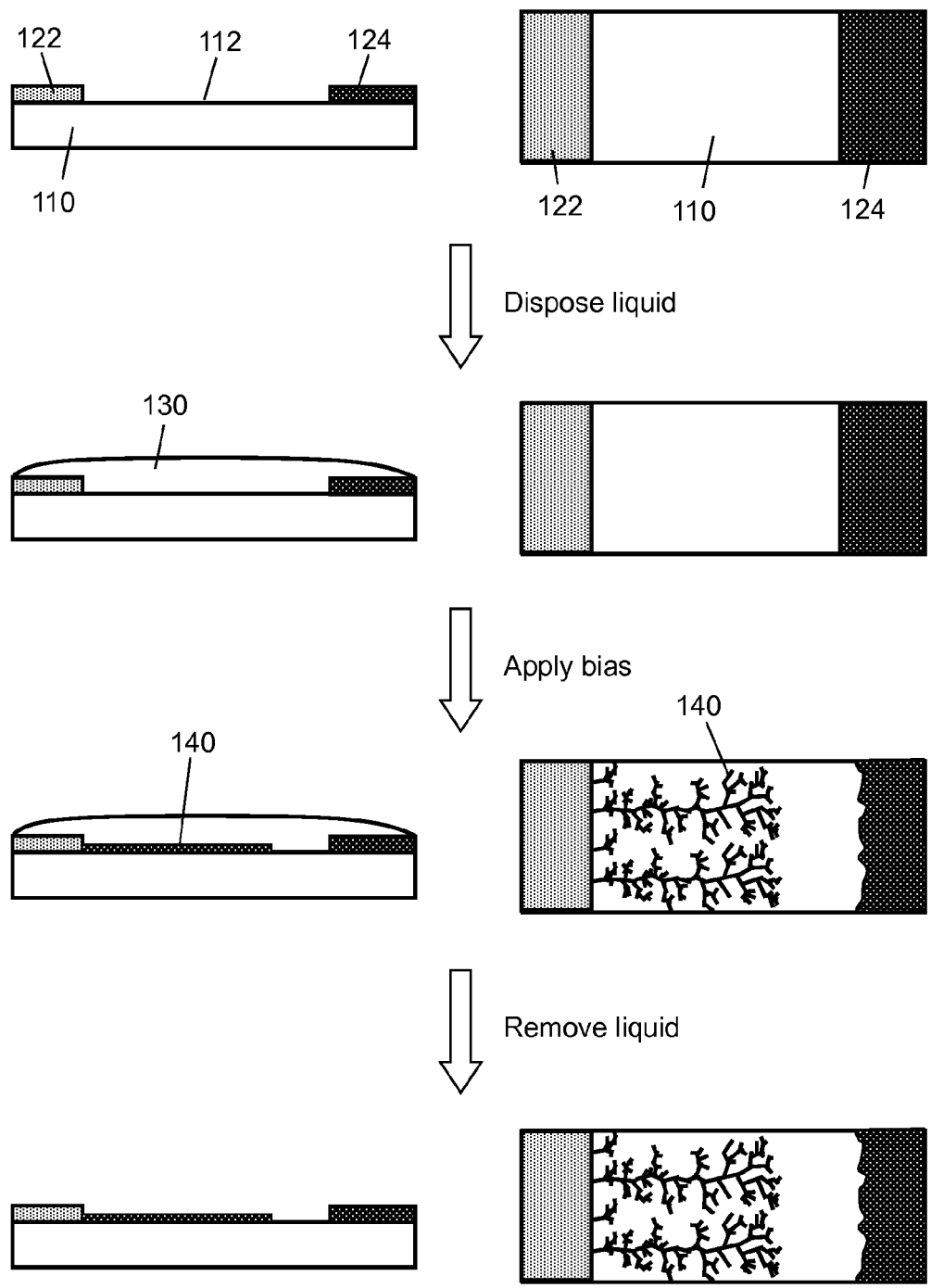
FIG. 1 is a schematic depiction of a method according to one embodiment of the invention.

One example of a method is shown in schematic top view and schematic cross-sectional view in FIG. 1. A substrate 110 having a surface 112 and a cathode 122 disposed thereon is provided. Also provided is an anode 124 formed from a metal; in this embodiment, the anode is also disposed on the surface 112 of the substrate 110. A liquid 130 in which the metal of the anode is at least partially soluble (i.e., in some cationic form) is then disposed on the surface of the substrate. As shown in schematic side view in FIG. 1, in this embodiment, the liquid is simply disposed as a relatively thin film on the surface of the substrate, held in place by surface tension. The liquid is in electrical contact with both the anode and the cathode. A bias voltage is applied across the cathode and the anode sufficient to grow the dendritic metal structure 140 extending from the cathode.

Figure 2:
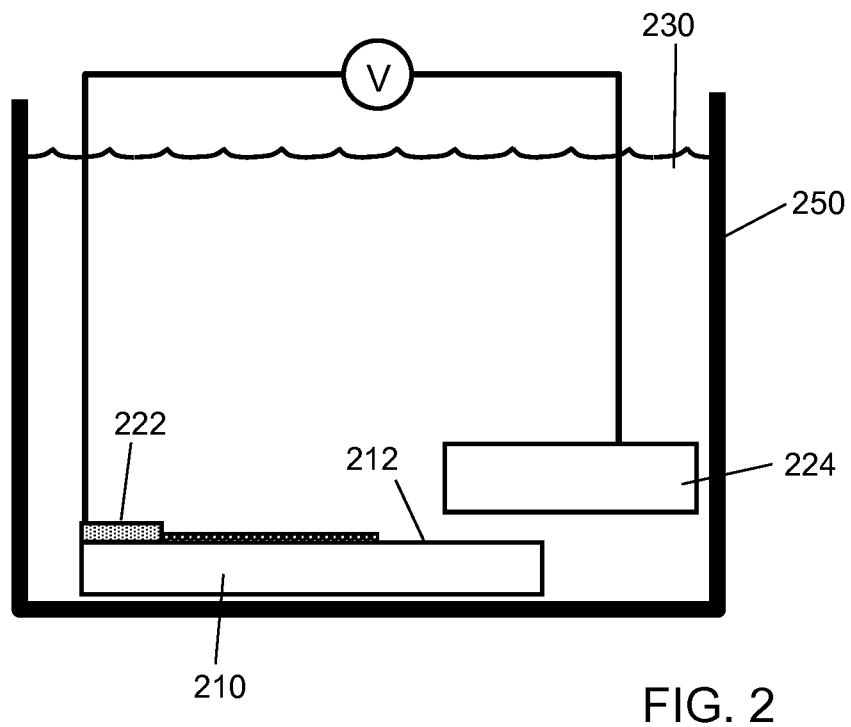
FIG. 2 is a schematic depiction of an apparatus for performing a method according to one embodiment of the invention.

An anode and a cathode are positioned relative to the substrate so that the dendritic metal structure can be electrodeposited. As the dendritic metal structure grows from the cathode, it is disposed on the on the surface of the substrate. The anode can be, for example, also disposed on the surface of the substrate. In such embodiments, the anode can help to direct the growth of the dendrite. In other embodiments, the anode is not disposed on the dendrite, but rather is in contact with the liquid. In such embodiments, the anode can, for example, be positioned within 1 cm, or even 5 mm of the surface. For example, FIG. 2 shows an embodiment in which the anode 224 is not disposed on the surface 212 of the substrate 210, but rather is suspended slightly above it. In this example, the liquid 230 is provided in a relatively large volume (i.e., in tank 250, in which the substrate bearing the cathode 222 and the anode are also disposed). In certain embodiments, the anode can be placed (i.e., not deposited, such as in the form of a separate piece of metal) on the surface, then removed from the surface after deposition. In such embodiments, the anode can help to direct the directionality of growth, as described above, but can easily be removed.

In certain embodiments, the anode is placed on the surface, but is not deposited thereon. For example, it can be placed or held in contact with the surface, so as to provide directionality to the growth of the dendritic metal structure, but be easily removed once growth is complete.

In the process of electrodeposition, metal cations in the liquid are reduced at the cathode. To replace the metal cations in the liquid and allow for continued growth of the dendritic metal structure, the anode can comprise a same metal as the metal of the dendritic metal structure. As the dendritic metal structure grows by reduction at the cathode, the anode is concomitantly oxidized and dissolved into the liquid, resulting in a net mass transfer from the anode to the growing dendritic metal structure. For example, the anode can be formed of silver, a silver alloy, copper or a copper alloy. When the metal is provided by the anode, the liquid need not have any metal ions dissolved in it when it is disposed on the surface of the substrate.

In other embodiments, the anode need not dissolve into the liquid, and the dendritic metal structures can be grown only from the metal initially dissolved into the liquid. For example, the anode can be relatively inert, as described below with respect to the cathode. In such embodiments, a relatively large volume of liquid can be provided in order to provide the desired amount of metal cations.

The cathode can be relatively inert and generally does not dissolve during the electrodeposition operation. For example, the cathode can be formed from an inert material such as aluminum, tungsten, nickel, molybdenum, platinum, gold, chromium, palladium, metal silicides, metal nitrides, and doped silicon. Moreover, the bias can be reversed to redissolve metal from the dendritic structures, thereby providing a method to more precisely tune the extent of dendrite growth. Of course, in other embodiments, the cathode need not be formed from an inert material. Indeed, when both electrodes are formed from the metal of the dendritic metal structures, either electrode can act as the cathode from which the dendritic metal structures grow (i.e., depending on the polarity of the bias), providing additional process flexibility. The person of skill in the art can select appropriate cathode materials based on the necessary electrodeposition conditions. Various configurations of electrodes suitable for use with the present invention are discussed, for example, in U.S. Pat. No. 6,635,914, which is hereby incorporated herein by reference in its entirety.

Contacts may suitably be electrically coupled to the anode and/or cathode to facilitate forming electrical contact to the respective electrode. The contacts may be formed of any conductive material and are preferably formed of a metal such as aluminum, aluminum alloys, tungsten, or copper.

Figure 3:
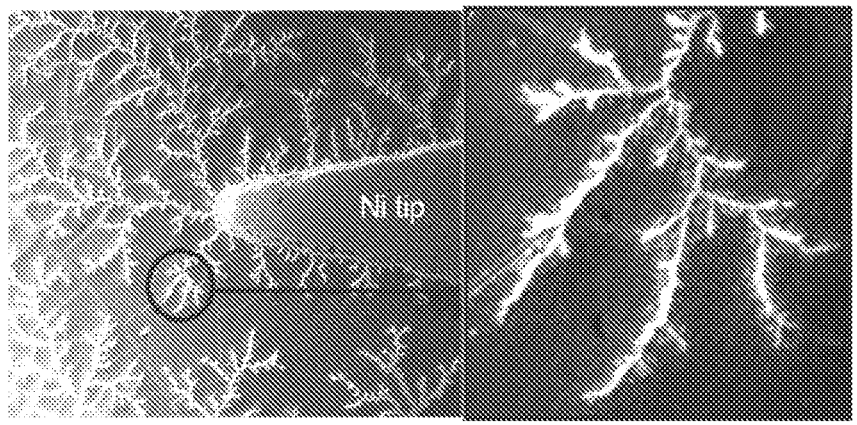
FIG. 3 is a photomicrograph of an illustrative example of a dendritic metal structure.
Figure 4:
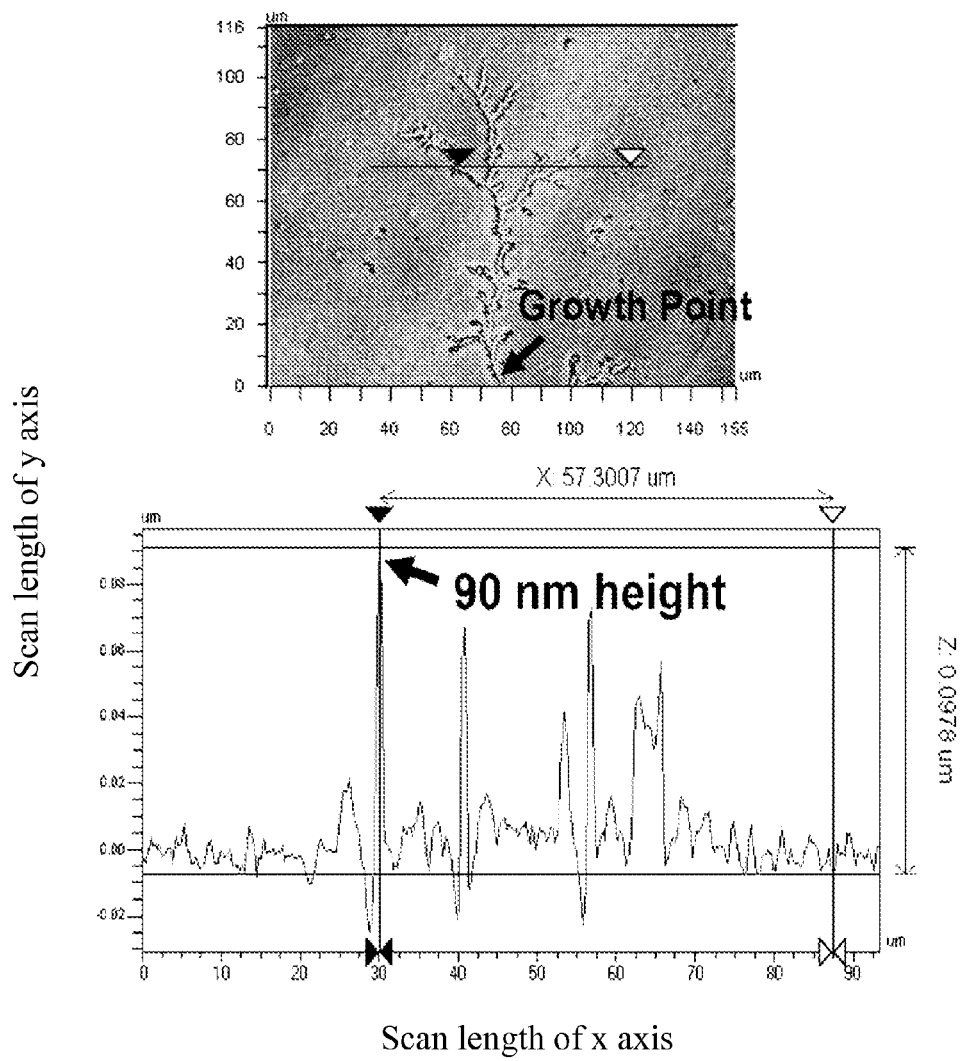
FIG. 4 is a profilometry measurement of another illustrative example of a dendritic metal structure.

FIG. 3 is a photomicrograph of an illustrative example of a dendritic metal structure (as described in International Patent Application Publication no. 2010/077622, which is hereby incorporated herein by reference in its entirety; the dendritic metal structures grown by the present procedures are substantially similar). In the illustrative example of FIG. 3, dendritic silver structures are grown from a nickel cathode. FIG. 4 is a profilometry measurement of another illustrative example of a dendritic metal structure as described in International Patent Application Publication no. 2010/077622. A dendritic metal structure has a multi-branched structure formed of segments of reduced ionic material. In certain embodiments of the invention, the at least one dendritic metal structure has an average individual segment width (i.e., in the plane of the dendritic metal structure) of no more than about 300 µm, no more than about 10 µm, no more than about 1 µm, or even no more than about 200 nm. In certain such embodiments, the at least one dendritic metal structure has an average individual segment width of at least about 20 nm. In one embodiment, the dendritic metal structure has an average thickness (i.e., normal to the plane of the dendritic metal structure) of no more than about 5 µm, no more than about 500 nm, no more than about 200 nm, or even no more than about 50 nm. In certain such embodiments, the at least one dendritic metal structure has an average thickness of at least about 10 nm.

The dendritic metal structure can be formed from a variety of metallic materials. For example, in one embodiment of the invention, the dendritic metal structure is formed from silver. Dendritic metal structures can also be formed, for example, from copper, or from zinc, gold or iron. Moreover, dendritic metal structures can be formed from mixtures of metals (e.g., codeposited from a solution containing mixtures of metal ions).

In one embodiment of the invention, when a sufficient bias (e.g., a hundred mV or more) is applied across the anode and the cathode, metallic ions (e.g., $Ag^+$) move from the anode (e.g., made of silver) and/or from in the liquid (e.g., ions originally provided in the liquid) toward the cathode. Metallic ions at the cathode are reduced to form the dendritic metal structure, which grows and extends from the cathode out onto the surface of the substrate. The amount of electrodeposited material is determined by factors such as the applied voltage, the identity of the metal, the identity of the liquid, the ion current magnitude and the time during which the current is allowed to flow. Electrodeposits can have significant growth parallel to as well as normal to the substrate surface. The applied bias can be, for example, in the range of 200 mV to 20 V, but the person of skill in the art will appreciate that other bias strengths can be used, and will select an appropriate bias strength to provide the desired growth of a given metal and electrode configuration.

As in any plating operation, the ions nearest the electron-supplying cathode will generally be reduced first. However, in real-world devices in which the nanoscale roughness of the electrodes is significant and the fields are relatively high, statistical non-uniformities in the ion concentration and in the electrode topography will tend to promote localized deposition or nucleation rather than blanket plating. Even if multiple nuclei are formed, the ones with the highest field and best ion supply will be favored for subsequent growth, extending out from the cathode as individual elongated metallic features. The deposition interface continually moves toward the anode, increasing the field and thereby speeding the overall growth rate of the electrodeposit.

Figure 5:
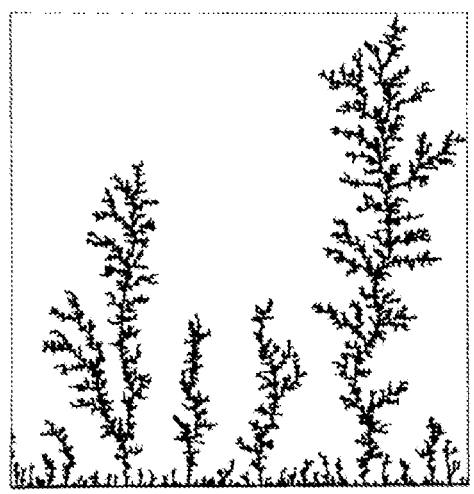
FIG. 5 is a top view schematic view of dendritic metal structures grown between parallel electrodes (i.e., an anode at the top of the figure and a cathode at the bottom of the figure)

While not intending to be limited by theory, the inventor surmises that the addition of new atoms to the growing electrodeposit occurs through a diffusion-limited aggregation mechanism. In this growth process, an immobile "seed" is fixed on a plane in which particles are randomly moving. Particles that move close enough to the seed in order to be attracted to it attach and form the aggregate. When the aggregate consists of multiple particles, growth proceeds outwards and with greater speed as the new deposits extend to capture more moving particles. Thus, the branches of the core clusters grow faster than the interior regions. The precise morphology depends on parameters such as the potential difference and the concentration of metal ions in the liquid. For high ion concentrations and high fields as are common in the devices described herein, the moving ions have a strong directional component, and dendrite formation occurs. The dendrites have a branched structure, but tend to grow along a preferred axis largely defined by the applied electric field. For example, FIG. 5 shows dendritic metal structures grown between parallel electrodes (i.e., an anode at the top of the figure and a cathode at the bottom of the figure) using methods described in International Patent Application Publication no. 2010/077622. Accordingly, placement of the electrodes can be used to provide a desired directionality of electrode growth.

Dendrite growth causes a mass transfer of metal from the liquid to the growing dendrite. When the liquid is not replenished with metal (e.g., by an anode), dendrite growth can significantly deplete the liquid of metal. Accordingly, in such situations, it can be desirable to use a larger volume of liquid (e.g., using a vessel of liquid, as shown in FIG. 2).

The liquid can be selected by the person of skill in the art, such that it dissolves the metal to be used in the growing dendrite. In certain embodiments, the liquid is somewhat conductive. Aqueous media can be used as the liquid. For example, the liquid can be water, or an aqueous solution of electrolyte. As described above, in certain embodiments, the liquid provides metal ions from which the dendritic metal structure is formed (for example, as a silver salt such as AgCl or a copper salt such as $CuSO_4$). It may be desirable to include a surfactant to aid in wetting of the necessary surfaces.

After deposition, the liquid can be removed from the surface of the substrate. For example, when the liquid is provided as a thin layer, it can be removed by methods such as blowing, spinning, gravity or suction. When the liquid is provided in a vessel, the workpiece can simply be removed from the vessel. In any case, it may be desirable to rinse the workpiece after deposition, especially when the liquid is of high ionic strength.

In certain embodiments of the invention, the bias voltage is in the range of 200 mV to 20 V, depending on the particular materials and configurations used.

The methods of the present invention can be performed at room temperature. Accordingly, the resulting dendritic materials can be formed with minimal residual/intrinsic stress, making them particularly well-suited for thin substrate applications (e.g., thin crystalline solar cells) in which the stress inherent in fabricating other conductor systems causes warping.

In one embodiment of the invention, the device includes one or more barrier layers, for example between the anode and the liquid and/or between the cathode and the liquid. Optional barrier layers can include a material that restricts migration of ions and/or that affects the threshold voltage required to form the electrodeposit. In accordance with certain embodiments of the invention, a barrier layer includes conducting material such as titanium nitride, titanium-tungsten alloy, a combination thereof, or the like. Use of a conducting barrier layer between the cathode and the liquid allows for the cathode to be formed of oxidizable material because the barrier prevents diffusion of the electrode material to the liquid. The diffusion barrier may also serve to prevent undesired electrodeposit growth within a portion of the structure; that is, the cathode can be patterned with an insulating material to provide for growth only from specific desired areas. In other embodiments of the invention, the barrier material includes an insulating material. Inclusion of an insulating material increases the voltage required to electrodeposit the dendritic metallic structures, which can in some embodiments help to avoid undesired growth.

The electrodeposition process can cause growth in the direction normal to the surface, creating dendritic metal structures of substantial thickness (e.g., in the range of 50 nm-500 nm, or even 100 nm-500 nm).

Growth rates will depend on the ion flux per unit area. Lateral growth rates can be, for example, in the range of 1-50 µm/s.

The invention has been described with respect to growth between a single cathode and a single anode. As the person of skill in the art will appreciate in view of the present disclosure, multiple electrodes can be used in the deposition processes described herein, with bias voltages applied between them simultaneously, sequentially, or both. For example, multiple cathodes and/or multiple anodes can be used, with different bias voltages applied between them simultaneously, in order to fine-tune the directionality of dendrite growth. In other embodiments, multiple cathodes and/or anodes can be supplied, and the bias voltage can be applied across only a pair of them, in order to cause dendritic growth only in one region of the device, but not in others.

Another advantage according to certain embodiments of the invention is that the electrodeposited dendritic metal structures can be repaired (e.g., in the field) at a later time. The person need only provide an anode and a liquid to the surface, and apply the necessary bias across the electrodes. Electrodeposition can continue until the local bias drops below the electrodeposition threshold. High resistance regions can exist, for example, in damaged sections of the dendritic metal structure, in which case such growth can be used to repair the structure. Damage to the dendritic metal structures caused by, for example, thinning at topographical features, stress during packaging, temperature or mechanical shock in the field, can be repaired thereby, The substrate can take many forms, as described in more detail with respect to devices, below. Notably, the dendritic metal structures can be disposed on a wide variety of devices, for example to provide an electrode for the device, or to provide a structure for tuning the mechanical response of the device. The surface of the substrate can be formed, for example, from germanium oxide, silicon oxide, nitride, or oxynitride, silicon, compound semiconductors, or polymeric materials. In certain embodiments, the surface of the substrate is substantially non-conductive (e.g., an insulator or a semiconductor, for example having a conductivity no more than about 0.001 Ohm-cm). Substrates can be flexible (e.g., built on thin sheets of polymer, metal or glass). Desirably, substantially no solid electrolyte (e.g., as described in U.S. Pat. No. 6,635,914 or International Patent Application Publication 2010/077622) is in contact with the dendritic metal structure.

In certain embodiments of the invention, an insulating layer is disposed between the dendritic metal structure and the electrically active structure during electrodeposition. An insulating layer can be suitable for use with a conductive electrically active structure. When the electrically active structure is not substantially less conductive than the liquid used to deposit the dendritic metal structure, the bias applied across the anode and cathode for electrodeposition can cause current flow through the electrically active structure instead of through the liquid, thereby greatly reducing the speed of electrodeposition. In certain embodiments in which an insulating layer is disposed between the electrically active structure and the dendritic metal structure, an annealing process can be used to drive the dendritic metal structure through the insulating layer so that it makes contact with the underlying electrically active structure. Alternatively, heat and pressure can be used to force the dendritic metal structure at least partially through the insulating layer. In certain embodiments, the insulating layer can be removed (e.g., by an etch process) to allow electrical contact between the dendritic metal structure and the electrically active structure. Such embodiments are especially suitable for use when the electrically active structure is a current generating structure. In embodiments in which the electrically active structure need not be in electrical contact with the electrically active structure (e.g., in field-based devices such as embodiments using electro-optic materials), the insulating layer can help to prevent short circuiting.

Another aspect of the invention is a device comprising a dendritic metal structure disposed on a surface of a substrate, wherein the dendritic metal structure is not in substantial contact with a solid electrolyte, for example, as described above.

For example, one embodiment of the invention is an electrical device comprising a first electrode comprising at least one dendritic metal structure (made, for example, as described above); a second electrode; and an electrically active structure disposed between the dendritic metal structure and the second electrode, wherein substantially no solid electrolyte is in contact with the dendritic metal structure. In this embodiment, the second electrode and the electrically active structure are part of the substrate on which the dendritic metal structure is formed, as described above.

Figure 6:
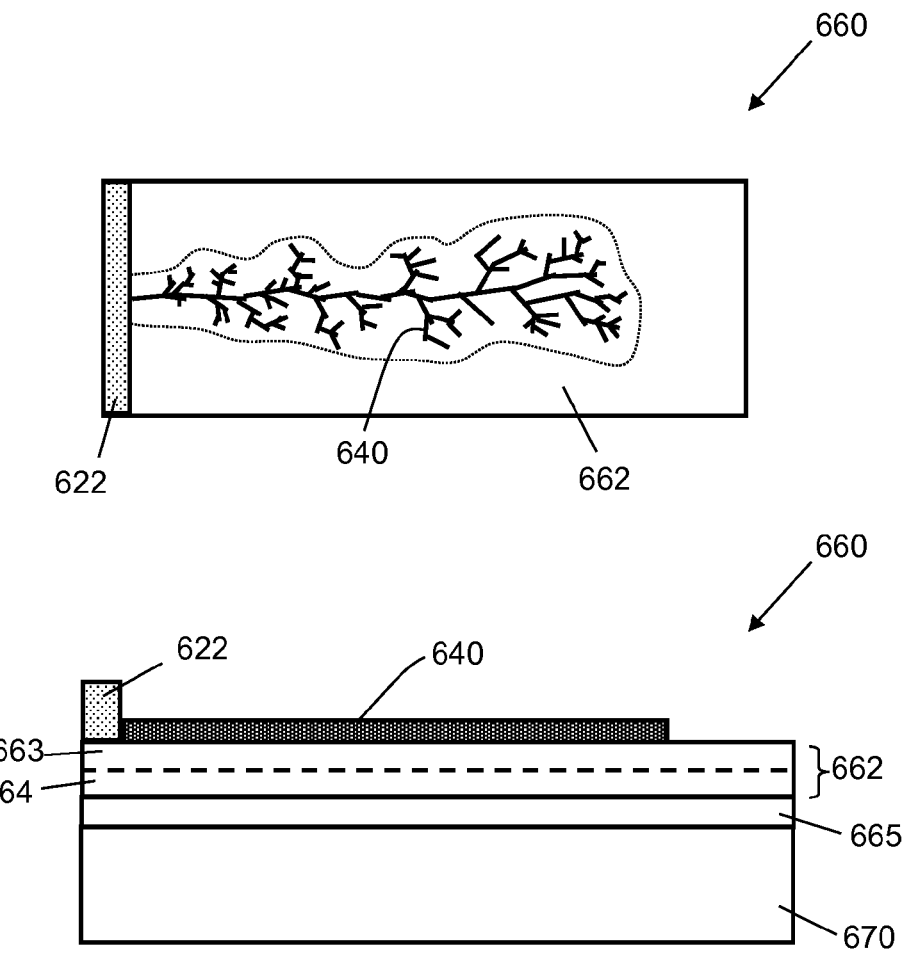
FIG. 6 is a top schematic view and a schematic cross-sectional view of an electrical device according to one embodiment of the invention.

One example of an electrical device according to this embodiment of the invention is shown in schematic top view and schematic cross-sectional view in FIG. 6. Electrical device 660 includes an electrically active structure 662, in this example a current generating structure including an n-type semiconductor layer 663 and a p-type semiconductor layer 664 (forming a p-n junction). On one side of the electrically active structure 662 is a first electrode that includes at least one dendritic metal structure 640. In the embodiment shown here, the first electrode also includes the cathode 622 from which the dendritic metal structure is grown. On the other side of the electrically active structure 662 is a second electrode 665 (disposed on device substrate 670). In this example, in which the electrically active structure is a current generating structure, the at least one dendritic metal structure and the second electrode are in electrical contact with the current generating structure. In use, generated current (e.g., photogenerated current) runs between the at least one dendritic metal electrode and the second electrode (i.e., in either direction). In other embodiments of the invention, the electrically active structure need not be a current generating structure, and the electrode including the dendritic metal structure and the second electrode need not be in electrical contact with the electrically active structure.

The resistance of a dendritic metal structure depends on the conductivity of the metal and the length and cross-sectional area of the structure. The conductivity of silver structures with features having height and width in the few tens of nanometers is $5\times10^5$ S/cm. For a single silver structure that is 1 mm in length, 10 µm wide and 20 nm thick, the resistance is about 100 Ω While this value may appear high, in use there will be multiple branches and/or multiple dendritic metal structures, so that the net resistance will be a series-parallel combination of all individual resistances, and therefore will be much, much lower (e.g., on the order of a few Ω).

Figure 7:
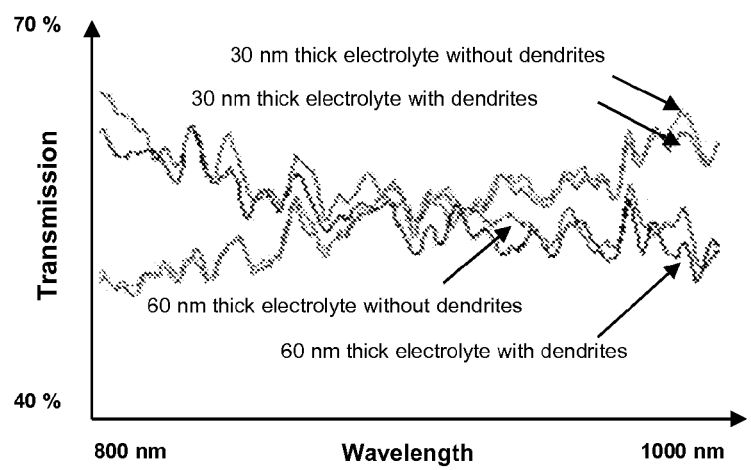
FIG. 7 is graph showing the transmission of 30 and 60 nm films of solid electrolyte with and without dendritic structures formed thereon.

The use of a dendritic metal structure in an electrode can result in a number of advantages. Due to its multi-branched structure, the dendritic metal structure can effectively interact with a large area (e.g., the dotted line shown in FIG. 1) of the electrically active structure without occluding a substantial portion of its area. Accordingly, a dendritic metal structure can provide both reduced resistance current collection and reduced occlusion of underlying layers, making it suitable as a top electrode in electrical devices that photogenerate current, such as solar cells and photodetectors. Dendritic metal structures can also be made to be "nanoscale" in both thickness and width of the individual conducting elements, which allow them to be relatively transparent while covering a large area. For example, as shown in the graph of FIG. 7, the transmission of 30 and 60 nm thick films of solid electrolyte (as described in International Patent Application Publication no. 2010/077622) in the wavelength range of 800-1000 nm is not substantially affected by dendrite growth. Moreover, the low optical occlusion and high area coverage of the dendritic metal structure can make them useful as electrodes in field-based optical devices such as liquid crystal devices and electro-optic devices. Moreover, as described above, because the dendritic metal structures can be formed using deposition from a solid electrolyte (instead of a micro- or nanolithographic process), the fabrication of such devices can be relatively simple and therefore of low cost. And according to the present invention, the dendritic electrodes need not be formed using a solid electrolyte, so that they can more easily be formed into a device with high activity throughout visible wavelengths.

The second electrode can be formed as a metallic layer, for example aluminum or copper, disposed on one side of the electrically active structure. The second electrode can be a substantially uniform layer, or can be patterned or masked to provide electrical contact with the electrically active structure only in certain areas. The second electrode can, for example, be disposed on a supporting device substrate, or in certain embodiments can itself be the substrate (e.g., when the second electrode is used as an electrical ground as in a liquid crystal based device).

The electrically active structure can take any number of forms. For example, in certain embodiments of the invention, the electrically active structure can be a photocurrent generating layer, such as those used in solar cells and photodetectors. For example, a current generating structure can be formed as a p-n junction as described above. In other embodiments, a current generating structure is formed from cadmium telluride, copper-indium selenide, gallium arsenide, organic semiconductor or silicon-based materials.

In other embodiments, the electrically active structure changes its optical properties in response to an applied field, with the first electrode including the dendritic metal structure and the second electrode configured to apply the field to the electrically active structure. The electrically active structure can be, for example, an electro-optic material such as lithium niobate, or a liquid crystal material. In certain embodiments, the photocurrent generating layer generates current when illuminated with optical energy having a wavelength greater than about 600 nm (e.g., in the red, near-infrared, or infrared ranges of the optical spectrum).

In certain embodiments of the invention, the dendritic metal structure and the second electrode are separated by less than about 100 µm, less than about 50 µm, or even less than about 25 µm. In such devices, acceptable field strengths can be achieved with relatively low voltages when used with electro-optic materials. Similarly, efficient generation and collection of current can be achieved when used with current generating structures.

Figure 8:
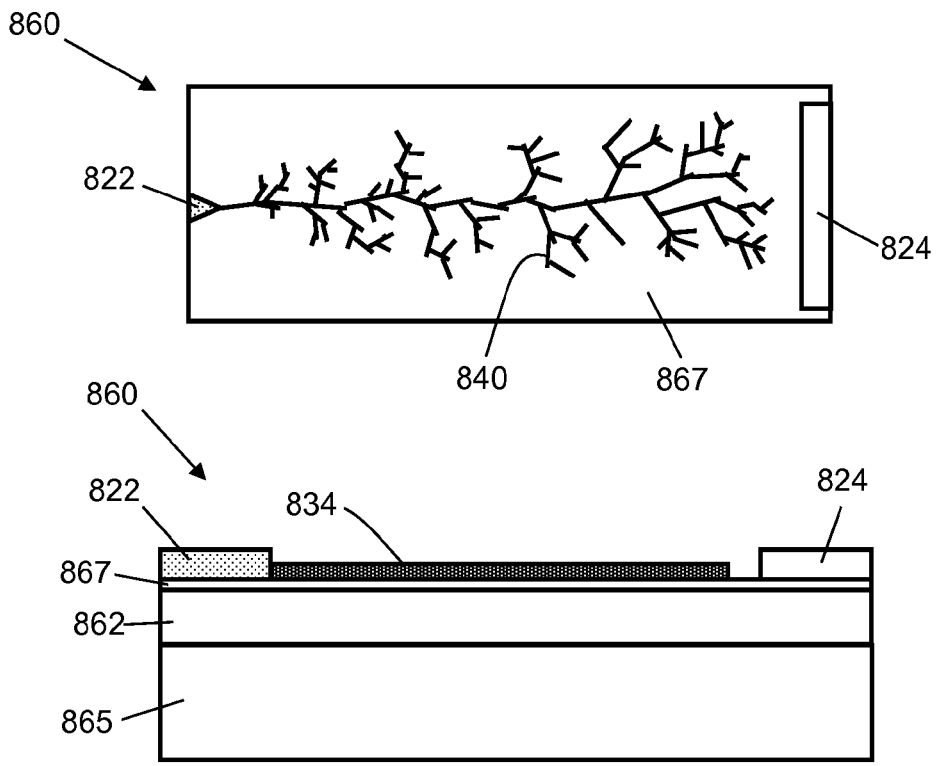
FIG. 8 is a top schematic view and a schematic cross-sectional view of an electrical device according to another embodiment of the invention.

Another embodiment of the invention is shown in schematic cross-sectional and schematic top view in FIG. 8. Electrical device 860 includes an electrically active structure 862 disposed on second electrode 865. An insulating layer 867 is disposed on the electrically active structure 862, with cathode 822 and anode 824 disposed thereon. In one embodiment, the anode and the cathode are coplanar and parallel. In other embodiments, the anode and the cathode can be configured in other geometries (e.g., concentric, triangular, or even with the anode removed from the surface). The cathode can, for example, be shaped or textured to promote nucleation and growth at particular points along its length (using, for example, a sawtooth shape). Dendritic metal structures 840 extend from cathode 822 toward anode 824. The cathode 822 and the dendritic metal structures 840 act as the top electrode of the electrical device 860; the cathode can act as a bus bar and provide an area for electrical contact to a circuit.

Figure 9:
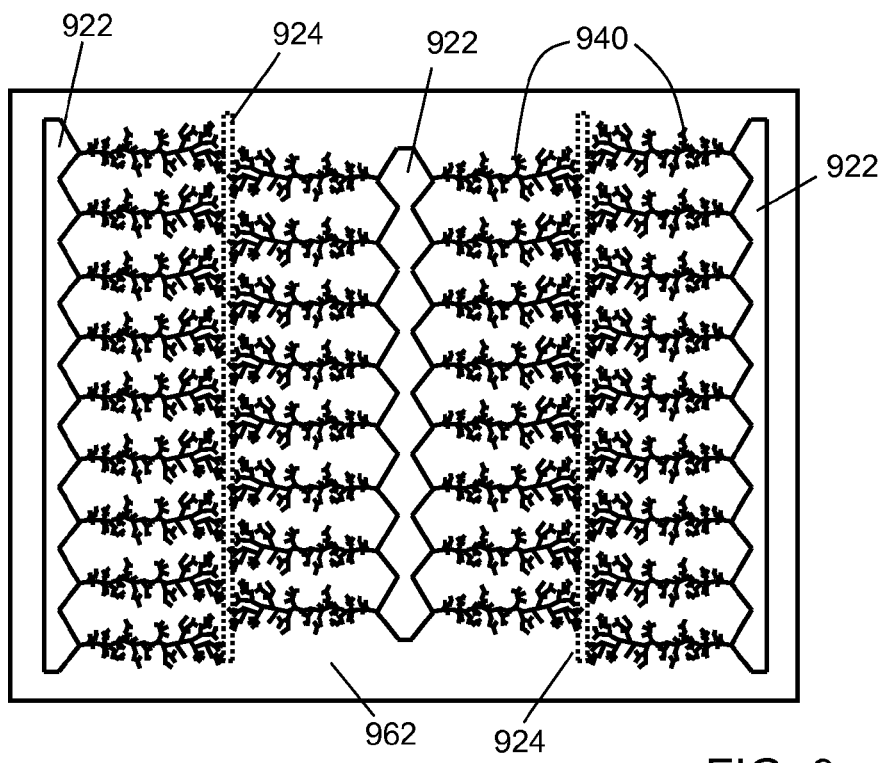
FIG. 9 is a top schematic view of an electrical device according to another embodiment of the invention.

Another embodiment is shown in schematic top view in FIG. 9. In this embodiment, the anode is sacrificial, and is substantially completely consumed during the electrodeposition process. Cathodes 922 are formed on the surface of electrically active structure 962, with sacrificial anodes 924 (shown in dotted line outline) formed therebetween. Dendritic metal structures 940 extend from cathodes 922 toward the original positions of anodes 924 (which can in some embodiments be substantially consumed during electrodeposition of the dendritic metal structures). The person of skill in the art can determine the size and thickness of a sacrificial anode that provides the desired dendritic metal structure growth. Of course, as described above, in other embodiments, the anode need not be disposed on the surface; if an anode is placed directly above (or even on) the surface, it can help to direct growth, but need not be consumed during the deposition.

The methods and devices of various aspects of the invention can be used to form a wide variety of devices. For example, in one embodiment, a solar cell can be made using the methods described herein, or using the electrical devices described herein. In another embodiment, a sensor such as a photodetector can be made using the methods described herein, or using the electrical devices described herein. A wide variety of photodetectors can benefit from the use of dendritic electrodes as described herein. For example, the photodetector can have a single pixel (e.g., as is common in in many instrumental, switching or security applications). In other embodiments, the photodetector can have multiple pixels, such as a multipixel photodetector for use in imaging applications. For example, dendritic metal structures such as those described herein can be used in the multipixel detectors used in cameras and in retinal implants.

Series resistance is an important parameter in solar cells, as a high series resistance will reduce the short circuit current and therefore reduce cell efficiency. The series resistance of a silicon solar cell structure decreases with sheet resistance, and therefore with dendrite growth, but contact (i.e., vertical) resistance is not altered significantly by dendrite growth due to the small contact area of the dendrites. High levels of dendrite growth can, however, ultimately increase series resistance due to dissolution of the electrodes. That is, the material removed from an anode to form extensive dendrite structures can result in a porous or eroded anode with a relatively high resistance. Accordingly, the person of skill in the art can select a degree of dendrite growth and an anode size that provides sufficient properties without unduly degrading the anode. Use of a sacrificial anode, the liquid, or a separate anode to supply the metal can also avoid the problem of anode degradation.

Use of dendritic structures have been shown to decrease the series resistance and increase the short circuit current of solar cells (around 4 $cm^2$, n-type junctions on p-type wafers), as described in International Patent Application Publication no. 2010/077622. These beneficial electrical properties, coupled with the low occlusion of the dendritic structure, can lead to higher solar cell efficiency than conventional electrolyte patterns alone.

In another embodiment, a light emitting diode, such as an organic light emitting diode, can be made using the methods described herein, or using the electrical devices described herein. For example, in certain embodiments, the electrically active structure is the various layers of the (organic) light emitting diode. Especially advantageously in the case of organic light emitting diodes, the conditions used to make dendritic metal structures can be relatively gentle, so as to avoid degradation of the organic material.

In various aspects of the invention, very finely structured electrodes can be advantageously formed without the use of micro- or nanolithographic techniques, leading to significant cost and throughput advantages in fabrication.

The person of skill in the art will recognize that the methods described herein can be used to make devices that do not include an electrically active layer. Indeed, electrical devices as described herein can be built on a wide variety of materials, such as insulators or semiconductors. Accordingly, another aspect of the invention is an electrical device comprising a substantially non-conductive material, with an electrode comprising at least one dendritic metal structure disposed on the substantially non-conductive material. Substantially no solid electrolyte is in contact with the dedritic metal structure. Methods similar to those described above can be used to make such devices, and such devices can generally have similar characteristics to those described above. For example, the dendritic metal structure can be formed in some embodiments from silver or copper; and can have an average thickness, for example, no more than about 200 nm. In certain embodiments, the at least one dendritic metal structure has an average individual segment width of no more than about 1 µm. The electrode can be electrically coupled to other electrical structures in the device, depending on the function of the device and the electrode therein, as the person of skill in the art would appreciate.

In certain embodiments, the insulator is substantially transparent to visible light (e.g., at least 75% or even at least about 90% averaged over the 400 nm-700 nm wavelength range). In certain devices, such as displays and photodetectors, it is desirable to provide an electrode while maintaining a high light transmission to or from an underlying structure. The use of an electrode comprising a dendritic metal structure as described herein can be especially advantageous when disposed on a transparent insulator, as the combination will allow relatively high transmission to or from an underlying structure, such as a light emitting structure (e.g., an LED, LCD, CRT or plasma display, or a photodetector).

The electrical device can be, for example, a touchscreen, for example a capacitive touchscreen. Conventional touchscreens are particularly susceptible to mechanical stress, which causes the relatively thick and brittle indium tin oxide (ITO) transparent conductor to crack, raising the sheet resistance and reducing sensitivity. The dendritic electrode systems described herein can be made to be flexible and self-healing, and can be used as the top (transparent) electrode of a touchscreen, increasing device lifetime and reliability. Moreover, use of the dendritic electrode systems described herein can be advantaged in that the world's supply of indium is dwindling rapidly, rendering use of ITO more expensive and less sustainable. Accordingly, another aspect of the invention is a touchscreen including an electrical device as described above, or made by a method as described above.

Devices including dendritic metal structures need not be electrical in nature; the dendritic metal structures can provide functions other than electrical conductivity. For example, as described in International Patent Application Publication no. WO 2009/064577, which is hereby incorporated herein by reference in its entirety, dendritic metal structures can be used to tune the response of microphone structures. Accordingly, in certain aspects, a device comprises a substantially non-conductive substrate, and at least one dendritic metal structure disposed on the substrate, wherein substantially no solid electrolyte is in contact with the dendritic metal structure.

For example, in one embodiment, a microphone device includes at least one microphone element including a diaphragm suspended by a diaphragm substrate; and dendritic metal structure disposed on the diaphragm. Details of the microphone device can be found in International Patent Application Publication no. WO 2009/064577. A cathode can be disposed on or adjacent the diaphragm, as a base from which the dendritic metal structure can extend. The response of the device can be tuned by disposing the device in a liquid (as described above) and creating the appropriate electrical bias between the cathode and an anode (e.g., disposed in the liquid as described above) to either grow or dissolve the dendritic metal structure.

Figure 10:
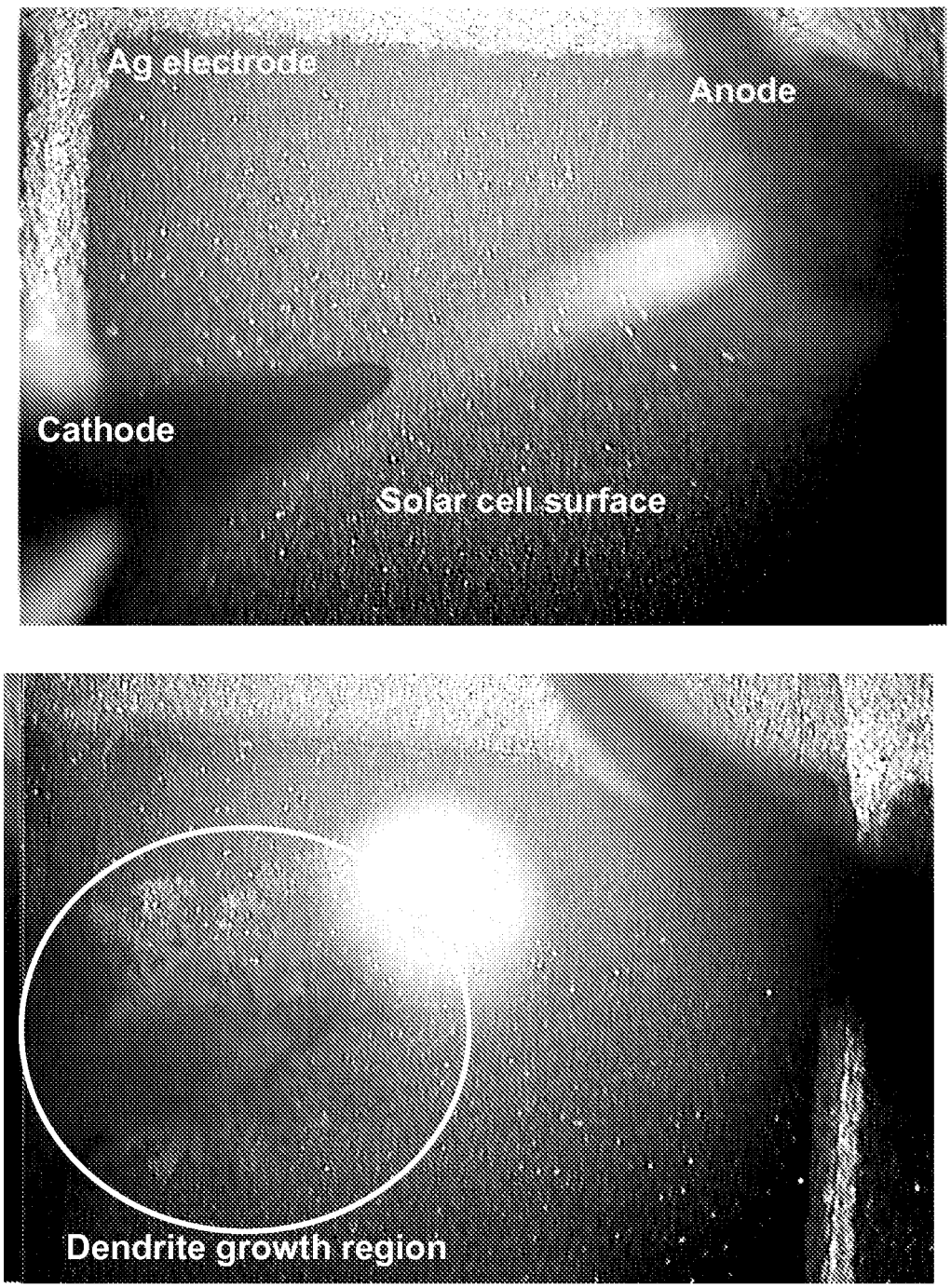
FIG. 10 is a pair of photomicrographs showing growth of a dendritic metal structure in a method according to one embodiment of the invention.

An example of the growth of a dendritic metal structure is shown in FIG. 10. A cathode and a silver anode were deposited on the surface of a solar cell, and a layer of water was disposed thereon. Dendrites were grown by applying a 20 V bias across the electrodes for 10 minutes. Of course, the person of skill will recognize that other conditions can be used. Dendrite growth was also observed on $SiO_2$ layers, at 5 V for 10 min.

Unless clearly excluded by the context, all embodiments disclosed for one aspect of the invention can be combined with embodiments disclosed for other aspects of the invention, in any suitable combination.

It will be apparent to those skilled in the art that various modifications and variations can be made to the present invention without departing from the scope of the invention. Thus, it is intended that the present invention cover the modifications and variations of this invention provided they come within the scope of the appended claims and their equivalents.

What is claimed is:

1. A method for constructing a dendritic metal structure, the method comprising:
   providing a substrate having a surface and a cathode disposed on the surface, wherein the substrate comprises an electrically active structure;
   providing an anode comprising a metal; and
   disposing a liquid electrolyte on the surface of the substrate, such that the liquid electrolyte is in electrical contact with the anode and the cathode, wherein the liquid electrolyte comprises dissolved metal ions of the same type as the anode metal;
   applying a bias voltage across the cathode and the anode sufficient to grow the dendritic metal structure extending from the cathode on the surface; and
   removing the liquid electrolyte from the surface of the substrate after applying the bias voltage to grow the dendritic metal structure.

2. The method according to claim 1, wherein the dendritic metal structure is formed from the metal of the anode.

3. The method according to claim 1, wherein the dendritic metal structure is formed from the metal ions provided in the liquid electrolyte.

4. The method according to claim 1, wherein the anode is disposed on the surface of the substrate.

5. The method according claim 1, wherein the liquid electrolyte is an aqueous liquid.

6. The method according to claim 1, wherein the surface of the substrate is substantially non-conductive.

7. The method according to claim 1, wherein the electrically active structure generates current in response to absorption of light.

8. The method according to claim 7, wherein the electrically active structure is a p-n junction.

9. The method according to claim 1, wherein the electrically active structure changes its optical properties in response to an applied field.

10. The method according to claim 1, wherein the surface of the substrate is formed from germanium oxide, silicon oxide, nitride, oxynitride, silicon, compound semiconductors, or a polymeric material.

11. The method according to claim 1, wherein substantially no solid electrolyte is in contact with the dendritic metal structure.

12. The method according to claim 1, wherein the dendritic metal structure is formed from silver or copper.

13. The method according to claim 1, wherein the dendritic metal structure is formed from silver.

14. The method according to claim 1, wherein the dendritic metal structure is no more than about 200 nm in average thickness.

* * * * *